United States Patent
LaGrotta et al.

[11] Patent Number: 6,105,875
[45] Date of Patent: Aug. 22, 2000

[54] DIRECT AIR COOLING OF OUTDOOR ELECTRONIC CABINETS

[75] Inventors: James T. LaGrotta, Boonton; Richard T. LaGrotta, Livingston, both of N.J.

[73] Assignee: Lucent Technologies, Inc., Murray Hill, N.J.

[21] Appl. No.: 09/149,986

[22] Filed: Sep. 8, 1998

[51] Int. Cl.⁷ .................................. B60H 1/20; F28F 7/00
[52] U.S. Cl. ........................................ 236/44 A; 165/80.3
[58] Field of Search ............................... 236/44 A, 44 R, 236/44 C; 165/80.3; 62/259.2, 223

[56] References Cited

U.S. PATENT DOCUMENTS

| | | | |
|---|---|---|---|
| 3,332,620 | 7/1967 | Streed | 236/44 A |
| 5,136,856 | 8/1992 | Yamamoto et al. | 165/80.2 |
| 5,934,368 | 8/1999 | Tanaka et al. | 236/44 A |

*Primary Examiner*—William Wayner
*Attorney, Agent, or Firm*—Michael Y. Epstein; Henry I. Schanzer

[57] ABSTRACT

Outdoor, electronic component containing cabinets are cooled by forced circulation of outside air through the cabinet for direct, cooling contact with the components. The incoming air is filtered, heated as necessary to evaporate water droplets in the air prior to entry of the air into the component containing portions of the cabinet, and the air flow is regulated for slowing the flow rate of the air within the cabinet as is necessary for maintaining the relative humidity within the cabinet below a maximum percentage; typically 40%.

7 Claims, 2 Drawing Sheets

DIRECT AIR COOLING OF OUTDOOR ELECTRONIC CABINETS

BACKGROUND OF THE INVENTION

This invention relates to the cooling, by air circulation, of outdoor electronic cabinets, and particularly to the cooling of such cabinets by the flow of outside air directly into contact with the electronic components within the cabinet.

In connection with various communication networks, particularly telephone networks, a common practice is to house various electronic components within cabinets disposed at outdoor sites spaced throughout the network. The cabinets stand in the open and provide the sole protection of the electronic components from outside weather conditions.

The electronic components generate heat, and a long standing problem (particularly for cabinets directly exposed to the sun) is the removal of excess cabinet heat. Typically, this is done by air circulation, first by air within the cabinets for conveying heat from heat producing components to a heat exchanger, and second by external air (kept separate from the internal air) past the heat exchanger for the removal of the heat. Originally, self-generated air circulation was sufficient. Then, as the density of components within the cabinets increased, forced air circulation became necessary. Problems now encountered are that large quantities of air must be continuously circulated at relatively high acoustic noise levels and great costs. Also, because the cabinet interior air temperature must be higher than the outside air temperature, for outward direction heat flow, the temperature within the cabinet tracks the outdoor temperature. Typically (although obviously varying from cabinet to cabinet), the cabinet interior temperature is around 19° C. higher than the outside air temperature. However, the higher the temperature of the interior air, the less efficient is the cooling of the components by the circulating air, and heat removal thus requires greater air circulating speeds or higher component temperatures. Either result is undesirable.

It is recognized that greater efficiency of heat transfer would be obtained if the outside air were blown directly against the heat generating components. This would eliminate the aforementioned temperature difference between the inside and outside air temperatures. However, using untreated outside air is out of the question owing to the danger of contamination of the components being cooled. Within large structures, such as telephone network central offices, particularly where people are present, the large cost of treating outside air for use within the structures is both necessary and reasonably cost effective because of the huge volumes of air being treated. For the much smaller outdoor electric cabinets, however, it has long been accepted that the needed treatment of outside air for direct cooling is far too expensive to be practical. Accordingly, the outside cooling air is never admitted into direct contact with the heat generating components. (Some cabinets are vented to the outside area, but only small volumes of air are exchanged, and not for rapid cooling purposes.)

In accordance with the present invention, however, outside air, treated as necessary for avoiding damage to the housed components, is blown directly into contact with the components for increasing the efficiency of heat removal and at reduced cost.

SUMMARY OF THE INVENTION

Outside air is filtered for removal of dirt and water particles and blown directly against heat generating components within a cabinet for cooling the components. Aside from the filtering of the air, the only other treatments generally required of the outside air (as later discussed) are that of maintaining the relative humidity of the air within the cabinet below a preselected maximum value and removing water in liquid form (fog droplets) from the incoming air. While the filtering, relative humidity maintenance of, and water droplet removal from the incoming air involve energy costs not present in systems maintaining the cooling air separate from the interior air, the efficiency increase provided by the direct contact of the outside air with the components, thus requiring lower air circulating rates for a given amount of heat removal, more than compensates (in most instances, as later discussed) for the energy used for treating the outdoor cooling air.

In a preferred embodiment, an electronic cabinet according to the invention comprises a speed controllable fan for blowing outside filtered air into the cabinet for direct cooling contact of the outside air with the components, a sensor for monitoring the relative humidity of the cooling air within the cabinet and for regulating the fan speed for maintaining the relative humidity within the cabinet below with maximum value, and a heater, preferably within the air input port of the cabinet, for heating the incoming outside air as necessary for removing water droplets from the incoming air. For improved filtering of the incoming air, outside air is sucked into a vertically extending duct for upward passage past one or more flow diverting baffles for removing large particles from the flowing air.

DESCRIPTION OF PREFERRED EMBODIMENTS OF THE INVENTION

Figure 1:
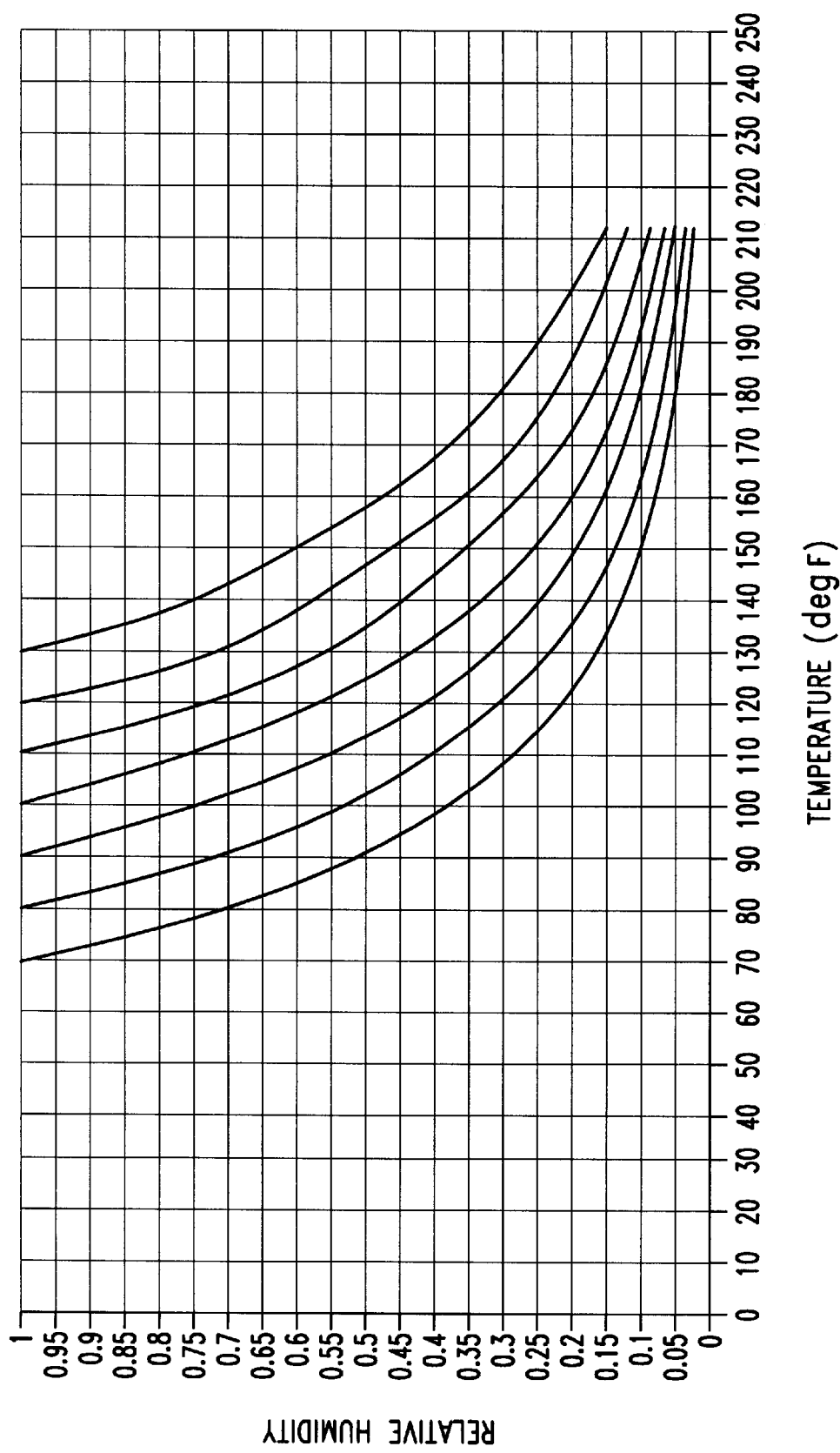
FIG. 1 is a graph showing relative humidity as a function of air temperature with the absolute humidity of the air being constant.

In the following discussion, relative advantages and disadvantages of cabinets according to the invention are discussed in comparison with cabinets of comparable volume and internal heat generation which are closed from the outside air and cooled by conduction of heat from cabinet interior air through a heat exchanger to outside air.

It is known that if the temperature of moving, cooling air within a cabinet can be reduced, the more efficiently can heat be transferred from the components being cooled to the air. For a given quantity of heat to be removed and given temperatures of the components, the higher efficiency heat transfer allows a reduced rate of air flow, hence a reduced amount of energy required to circulate the cooling air.

Conversely, because the outside air must be treated to make it safe for use within the cabinet, energy must be consumed for air treatment processes. Traditionally, it was thought that the costs for treating the outside air would significantly exceed the cost savings from the direct use of the outside air.

The inventors herein challenged this previous belief and, upon examination, arrived at quite encouraging conclusions.

One recognized requirement for the use of outdoor air for direct cooling is that the incoming air must be filtered for dirt and water droplets. Also, the unattended life of the filter system (i.e., the operating time between inspection and cleaning visits) must be adequately long, e.g., at least three years for cabinets used in telecommunication networks. A search of the air filtering arts reveals (as further discussed hereinafter) the existence of filters suitable for use in the inventive cabinets, and at adequately low initial capital and operating costs. The filters are effective against air borne solid particles and relatively large water droplets.

Aside from the need for filtering, the only other treatments generally required of the incoming air are that water in liquid form be removed from the incoming air and that the relative humidity within the cabinets be maintained below a preferred level depending upon the components within the cabinet. For cabinets used in the telecommunications industry, the preferred maximum relative humidity is 40%. This is now explained.

The electronic components housed within typical telecommunication network cabinets cover a wide range of individual components many of which are mounted on printed circuit boards which are removably stacked within shelves of the cabinet much like books are shelved in a library stack. The individual components, e.g., semiconductor and light processing devices, power transformers, electrical-mechanical couplers, and the like, are typically individually encapsulated, or are of suitable materials, as to be relatively immune to high humidity conditions. The components most susceptible to damage from high humidity are the printed surfaces of the printed circuit boards. (Such boards can comprise, simply by way of one example, flat plates of fiber glass having a pattern of electrically conductive paths therein; the smallest spacings between adjacent paths being around 0.002 inch.)

Specifically, water droplets are absorbed by dirt on the printed board surfaces causing shorting together of adjacent electrified paths. Examination of the wetting process reveals, however, that the wetting problem does not occur until the relative humidity exceeds around 40%. Below 40%, little or no wetting occurs, while above 40% the rate at which wetting occurs increases relatively rapidly. The 40% mark is thus a preferred and safe maximum value for the printed circuit boards. At this maximum relative humidity, for protecting the printed circuit boards, all other components typically found in cabinets are safe against damage.

A goal, therefore, is the treatment of the incoming air to maintain the relative humidity within the cabinet at less than some maximum level, e.g., the aforementioned 40%. As described, the 40% level is selected based upon the presence of printed circuit boards within the cabinets. Additionally, and based upon the fact that any number of various electrical and optical components are manufactured for safe use within industrial buildings wherein the relative humidity is maintained between around 40–60%, the 40% level herein specified (i.e, considerably lower than the acceptable indoor upper level of 60%) is clearly effective for preventing water related damage to the great majority of components likely to be housed in outdoor cabinets. Exceptions do exist, e.g., where extremely large voltages (e.g., around 10,000 volts) are involved. In such cases, extremely low relative humidity must be maintained (to prevent voltage arcing), and the herein specified 40% is too high. Still, even if much lower relative humidity must be maintained, direct cooling according to the present invention is still a workable solution even if, on a practical matter, a closed cabinet might be more cost effective.

Thus, while the specified 40% level is not an absolute level, in most instances, and certainly for cabinets for housing telecommunication equipment, the 40% value is a conservatively safe value and definitely a preferred value. Also, even if slightly higher maximum levels are permitted, the result will not be a universal failure of all the cabinets spaced within any system, but a proportionately slight increase in service outages which may or may not be acceptable.

Relative humidity is a function of temperature, and relative humidity can always be reduced, as desired, by adding heat to the air. The questions then are, how much heat and what is the effect of the air heating treatment on cabinet cooling?

FIG. 1 is a graph, including several curves, showing the relationship between relative humidity (plotted along the vertical axis) and temperature (in degrees F, plotted along the horizontal axis). Each curve shows, for a given mass of air containing a fixed quantity of water, the changes in relative humidity resulting solely from changes in air temperature. For example, the left-hand most curve shows that for a mass of air having a relative humidity of 1 (100%) at 70° F., the relative humidity is decreased to 0.4 (40%) upon heating the air to around 100° F. (plus 30° F.). Similarly, for the right-hand most curve, at 100% relative humidity at 130° F., the relative humidity is reduced to 40% by heating the air to around 168° F. (plus 38° F.).

In general, the higher the temperature of the air when at 100% relative humidity, the greater the change in temperature required to reduce the relative humidity to 40%. Significantly, however, in the vast majority of locations within the United States, the condition of air temperature of 130° F. and 100% relative humidity is quite rare, and cooler and drier air is typically present. One conclusion, therefore, is that at the vast majority of sites for cabinets in the US, the maximum amount of increase of the outside air temperature needed to reduce the relative humidity to at least 40% is around 30° F.

As previously described, an advantage of the invention is that it allows a reduction in temperature of the cabinet interior air in comparison with closed cabinets where the interior air is maintained separate from the outside air. The reason this is possible is that, in the closed cabinets, the interior air must, as previously noted, track the outside air temperature and, typically, the maximum temperature in the closed cabinets is around 19° C. (34° F.) higher than the outside air temperature. Accordingly, except under the worst conditions, the typical maximum heating of the outside air for ensuring a maximum 40% relative humidity (the aforementioned 30° F.) is less than the typical temperature differential of 34° F. in excess of the outside air temperature always present in closed cabinets.

Stated slightly differently, in typical closed cabinets, the maximum interior air temperature is, as previously explained, always around 34° F. higher than the outside air temperature. With the inventive cabinets, where the outside air is blown directly into contact with the components, should the relative humidity of the outside air be less than 40%, thus requiring no heating of the outside air admitted into the cabinet, the outside air blown against the components is significantly cooler than the circulating air within the closed cabinets.

Conversely, even if maximum heating of the outside air is necessary, typically no more than 30° F. for reducing the outside air relative humidity to 40%, the heated outside cooling air is still comparable in temperature to the cooling air in the closed cabinet. Thus, under typical worst conditions, the temperature of interior air of the inventive cabinets can be as high as that of the interior temperature of the closed cabinets. Under more normal conditions, however, cooler interior air temperatures will be present in the inventive cabinets.

Alternatively, rather than operating the cabinets at cooler temperatures, by allowing the interior temperatures to rise to the same temperatures as in the heat exchanger type cabinets, the amount of electrical component heat energy which can be removed is greatly increased, e.g., by a factor of two in some instances.

In general, any necessary heating of the incoming air for relative humidity control does not require an auxiliary heat source. This is because all the heat required (with a minor exception hereinafter explained) is present within the cabinet from the heat generating components. The outdoor air is heated as it enters the hot cabinet, with the rate of heating of the incoming air being a function of the flow rate of the incoming air. Control over the temperature of the incoming air is thus obtainable by varying the speed of fans drawing the outside air into the cabinets. Thus, by slowing the outside air flow into the cabinet, any needed heating of the incoming air is accomplished. [Suitable control systems for regulating operation of a motor (the fans in this application) in response to sensed parameter (relative humidity here) are well known.]

Auxiliary heating of the incoming air can be required, however, when the incoming air contains water in the form of small particles of water (as in a fog) too small to be filtered. In such cases, in order to remove the water particles prior to entry of the air into the cabinet (for preventing direct contact of the liquid water with the hot components), the outside air is preliminary heated, e.g., by a resistive heating element, disposed within a duct leading the outside air into the cabinet. Significantly, however, only relatively small amounts of heating (e.g., tens of watts in typical cabinets) are required for removal of such fog droplets.

In summary of the foregoing discussion, the means necessary for implementing the present invention in outdoor cabinets are: one or more sensors for sensing the relative humidity within a cabinet; a fan speed controller for varying the rate of flow of air drawn into the cabinet for varying the temperature of the air within the cabinet, an auxiliary heater for heating the incoming air for removing small particles of water; and an air filter system for removing dirt particles and relatively large drops of water. Additionally, in high salt environments (actually quite rare and encountered, for example, not beyond only a few hundreds of feet from large bodies of water), an active ionization filter for salt removal is also provided. Additionally, and as is common in closed cabinets, one or more thermometers are present for shutting down the housed equipment upon failure of the cooling system.

Figure 2:
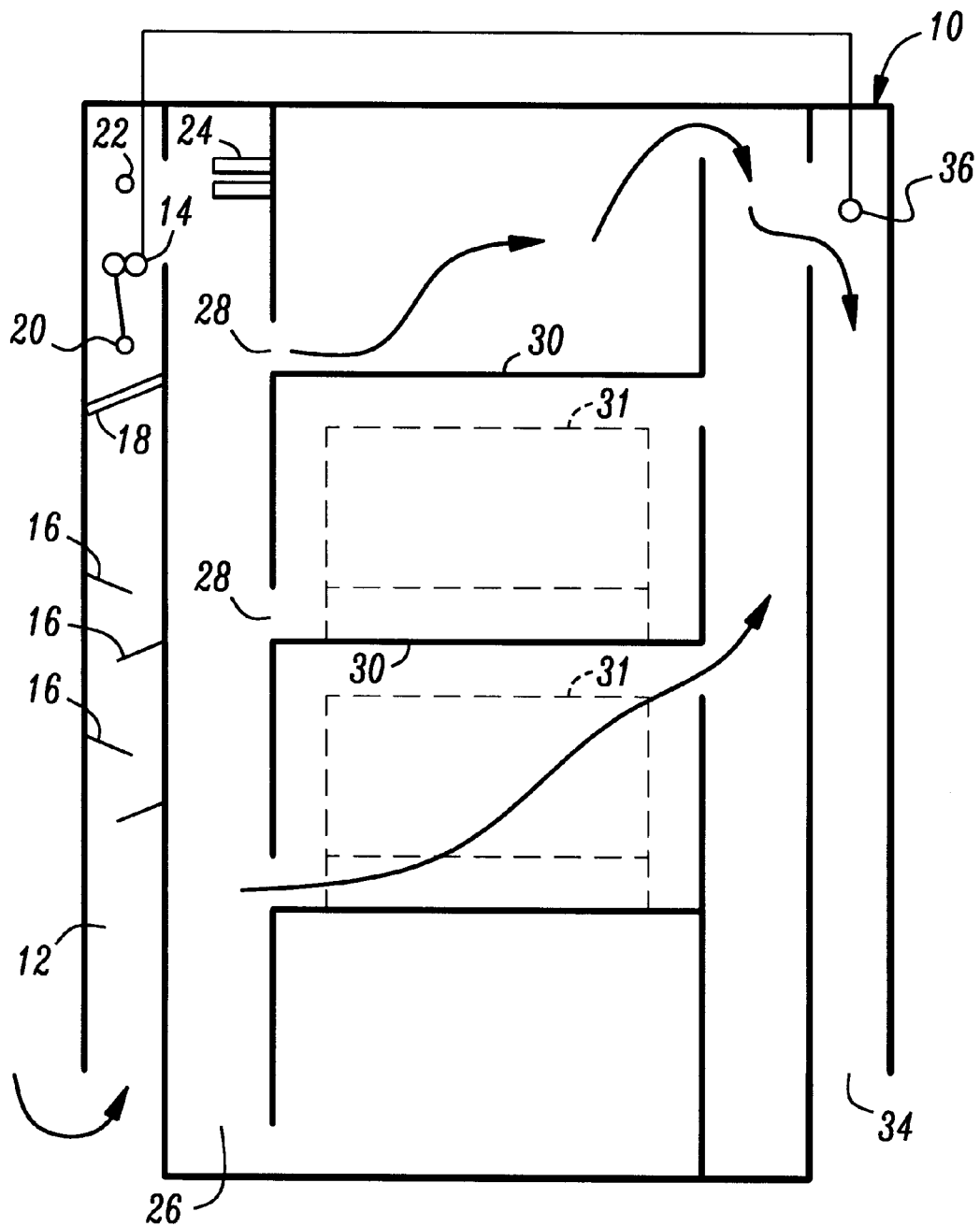
FIG. 2 is a schematic side elevational view of a known type electronic cabinet including means according to the invention for admitting and treating outside air for cooling purposes within the cabinet.

An example of an inventive cabinet 10 is shown in FIG. 2. Outdoor electronic equipment cabinets cooled by circulating interior air are well known. Except that the interior air must, in such known cabinets, be blown past heat exchangers, the basic arrangements of the known cabinets and the paths for circulating cooling air therein need not be changed in the inventive cabinets. Thus, rather than, in known cabinets, force circulating air from the discharge port of an internal heat exchanger towards the components to be cooled, outdoor air, in the inventive cabinets, is force circulated towards the components from an air inlet port. Because of the possible similarity in cabinet structures, an illustrative inventive cabinet is shown quite schematically in FIG. 2. Persons of skill will have no difficulty in designing actual cabinets based upon the teachings herein.

Preferably, outside air is admitted (FIG. 2) into an air inlet duct 12 opening at the bottom of a cabinet 10 in accordance with the present invention. The outside air is drawn into the duct 12 by one or more fans 14 disposed adjacent to the top of the duct. Disposed between the duct bottom opening and the fans 14 is a filter system including a filter 18 which can be of known type, such as HEPA filters used in the chemical processing industry for filtering particles from chemical treatment facilities.

By way of preferred example, the filter system additionally includes a number of baffles 16 in the path of the air through the duct 12 requiring the flowing air to make abrupt changes in direction of flow. This is a known technique for removing relatively large particles of dirt and water droplets being carried by the air. Thus, owing to the relatively large mass and inertia of the airborne particles, as the direction of the air flow abruptly changes for passing around the baffles 16, the particles tend to collide with and bounce off the baffles. While small particles may be carried forward by the moving incoming air, the larger particles tend to fall downwardly through the air column and completely out of the bottom of the duct.

By making the baffles 16 of metal, the baffles serve the additional purpose of closing the duct 12 to electromagnetic radiation noise passing either into or from the cabinet.

The air exiting the baffles 16 then passes through the air filter 18 of, for example, the afore-described type. The selection of the filter 18 is a matter of choice among many commercially available air filters depending on how clean need be the filtered air and the useful life of the filter before becoming excessively clogged. In general, and using a filter of the aforedescribed type (having a lifetime of around three years), the air exiting the filter 18 is filtered of particles having maximum dimensions in excess of 10–30 microns. The presence of the smaller size particles within the air admitted into the cabinets is not damaging to the components because the actual quantity of such small sized particles is quite small. Also, with the precaution that the relative humidity is maintained below 40%, the small quantity of dirt which does settle onto the printed circuit boards is prevented from collecting enough water to create short circuiting paths.

Additionally, a feature of filters of the aforedescribed type, as well as other commercially available filters, is that they can be cleaned by periodic back flushing of air. That is, by reversing the direction of rotation of the fan, air is blown through the filter 18 in the reverse direction, thus blowing collected dirt particles out of the filter and completely out of the air input port 12. Such cleaning of the filters is done on an as-needed basis by detecting the rate of air flow exiting the filter. This can be done by the use of a pressure sensor 20 located at the exit end of the filter 18. As the filter 18 becomes increasingly clogged with dirt, the rate of flow of air through the filter decreases causing a corresponding drop in air pressure between the fans 14 and the filter 18. At a preselected reduced air pressure, the filter is cleaned by the aforedescribed back-flushing procedure.

While obviously varying from location to location, experience with filter systems of the type described indicates that the filter need not be visited for replacement or hands-on cleaning for periods between 3 to 5 years.

Also disposed within the air inlet duct 12 is the aforementioned auxiliary source of heat, e.g., a known type of electrical resistance heater 24.

The heater 24 is disposed at a position for treating the incoming air before the air enters the component housing portions of the cabinet. In FIG. 2, the heater is shown at the upper end of the air import port 12 just downstream of the air driving fans. As mentioned, the purpose of the auxiliary heater is to vaporize water particles prior to entry of the water particles into the cabinet. Water particles reaching the components and contacting the components are immediately evaporated. The problem, however, is that the energy required to vaporize the liquid water causes a reduction of the temperature of the immediate area of the components where the vaporization occurs. Such localized cooling can cause an increase of relative humidity in the cooled area in excess of the 40% maximum allowable amount, hence is undesirable. By preliminarily heating the incoming air, thus vaporizing water particles in the inflowing air, the local area cooling problem is avoided.

The actual quantity of heat required to remove water droplets is surprisingly small. Under typical worst fog-like conditions, and for a typical rate of air flow of around 300 cubic feet per minute, only a 10 watt resistance heater 24 is required. This is an insignificant amount of power.

Indeed, because the extra 10 watts from the auxiliary heater 24 is so small, one possibility is to leave the heater on all the time. Alternatively, a known and commercially available fog detector 22 can be used for turning on the heater 24 only as required.

In the illustrative cabinet, the filtered outside air, heated as necessary, is discharged at the top end of a vertically extending duct 26 having a number of vertically spaced output ports 28 for directing the cooling air into lower portions of vertically spaced apart shelves 30 each mounting circuit boards 31 (shown schematically by dash lines) containing various heat producing electrical components. The cooling air then moves horizontally and vertically through each shelf for cooling the components thereon and the heated air exits each shelf into a collection duct 32 leading to an exhaust port 34.

As previously noted, the foregoing described air circulation pattern is by way of example only. Other known air circulating arrangements can be used.

One or more sensors 36 are disposed within the cabinet for sensing the relative humidity of the circulating air. Relative humidity sensors are well known, and no special type is required. In FIG. 2, a sensor 36 is shown disposed in the path of the heated air collected in the duct 34. As previously described, the sensor 36 continuously monitors the relative humidity of the air flowing past the sensor and, in response to measured humidities in excess of the critical level, e.g., 40% in the illustrative example, generates an output signal. The output signal is used (using a known signal processor) for reducing the speed of the inlet fans for so reducing the flow of the cooling air for heating it to the extent necessary for reducing the monitored relative humidity to 40% or less.

As previously described, under the worst outdoor conditions to be typically encountered in the U.S., the temperature of incoming outdoor air will not be increased, for humidity control, by more than 19° C. Thus, even under the worst conditions, the cabinet inside air temperature will be no higher than that present in an otherwise identical closed cabinet experiencing the same weather conditions.

As the outdoor conditions improve (drier and cooler) the fan speed is typically increased (within limits imposed by power consumption and noise consideration) for maximally reducing the cabinet interior temperature for cooler and more reliable operation of the components.

What is claimed is:

1. A method for cooling a cabinet comprising the steps of forcing circulating ambient filtered air into, through and outwardly from the cabinet and in direct contact with heat producing components within the cabinet, monitoring the relative humidity within the cabinet and, in response to the monitored relative humidity exceeding a maximum percentage value above which water caused damage of the components occurs, decreasing the rate of flow of air into the cabinet for causing heating of the air for reducing the relative humidity of the air to below said maximum percentage value.

2. A method according to claim 1 wherein said components subject to water caused damage are printed circuit boards, and wherein said maximum relative humidity value is 40 percent.

3. A method according to claim 1 including filtering ambient air for use within the cabinet by directing the ambient air upwardly through a vertically extending air input duct containing spaced apart baffles for causing abrupt changes in direction of the upwardly flowing air for precipitating dirt particles from the air by collisions with said baffles.

4. A method according to claim 3 including the step of flowing the air passing downstream of said baffles through a filter for capturing dirt particles of sizes smaller than the particles precipitated from the air by collisions with said baffles.

5. A method according to claim 4 wherein, in response to said filter becoming clogged by accumulated dirt, reversing the direction of air flow for flushing the collected particles out of the filter and downwardly through said air duct.

6. A method according to claim 5 including monitoring the pressure of the air flow downstream of said filter for determining the degree of clogging of said filter.

7. A method according to claim 1 including heating the air as necessary for reducing the relative humidity to below said maximum percentage value by circulating the air within cabinet portions being cooled by the air, and additionally heating the air before it enters said cabinet portions for evaporating water droplets carried by the air.

\* \* \* \* \*